US009024775B2

(12) United States Patent
Brockhaus

(10) Patent No.: US 9,024,775 B2
(45) Date of Patent: May 5, 2015

(54) CONTROL PANEL FOR A MEASURING DEVICE

(75) Inventor: Helmut Brockhaus, Dinslaken (DE)

(73) Assignee: KROHNE Messtechnik GmbH, Duisburg (DE)

( * ) Notice: Subject to any disclaimer, the term of this patent is extended or adjusted under 35 U.S.C. 154(b) by 908 days.

(21) Appl. No.: 13/196,238

(22) Filed: Aug. 2, 2011

(65) Prior Publication Data

US 2012/0032822 A1 Feb. 9, 2012

(30) Foreign Application Priority Data

Aug. 5, 2010 (DE) ........................ 10 2010 033 470

(51) Int. Cl.

*G08B 5/36* (2006.01)
*H04B 3/36* (2006.01)
*G09G 5/00* (2006.01)
*H03K 17/94* (2006.01)
*H01H 13/705* (2006.01)
*H01H 13/84* (2006.01)
*H01H 3/02* (2006.01)
*H01H 9/00* (2006.01)

(52) U.S. Cl.

CPC ............ *H01H 13/705* (2013.01); *H01H 13/84* (2013.01); *H01H 2003/0293* (2013.01); *H01H 2009/0083* (2013.01); *H01H 2217/012* (2013.01); *H01H 2225/03* (2013.01); *H01H 2239/022* (2013.01); *H01H 2239/03* (2013.01)

(58) Field of Classification Search

USPC ................................................ 345/175, 167

See application file for complete search history.

(56) References Cited

U.S. PATENT DOCUMENTS

| | | | | |
|---|---|---|---|---|
| 5,814,735 | A | 9/1998 | Kurisaki et al. | |
| 6,234,651 | B1 | 5/2001 | Kodama et al. | |
| 6,875,977 | B2 | 4/2005 | Wolter et al. | |
| 7,765,045 | B2 * | 7/2010 | Yoshida et al. | 701/36 |
| 8,058,577 | B2 | 11/2011 | Tissot | |
| 2006/0047386 | A1 * | 3/2006 | Kanevsky et al. | 701/36 |
| 2006/0066587 | A1 * | 3/2006 | Morohoshi et al. | 345/173 |
| 2007/0214937 | A1 * | 9/2007 | Stewart | 84/423 R |
| 2009/0051671 | A1 * | 2/2009 | Konstas | 345/174 |
| 2009/0167723 | A1 * | 7/2009 | Kwong et al. | 345/175 |
| 2009/0226179 | A1 * | 9/2009 | Yeh | 398/135 |

FOREIGN PATENT DOCUMENTS

| | | | |
|---|---|---|---|
| DE | 199 46 471 | A1 | 3/2001 |
| DE | 10 2009 013 440 | A1 | 9/2009 |

(Continued)

*Primary Examiner* — Jennifer Mehmood
*Assistant Examiner* — Pameshanand Mahase
(74) *Attorney, Agent, or Firm* — Roberts Mlotkowski Safran & Cole, P.C.; David S. Safran

(57) ABSTRACT

A control panel for a measuring device with a housing and a control and inspection window. The control panel includes at least one optical key that is operable through the control and inspection window using a finger. The optical key includes a transmitting element and a receiving element. The control panel is constructed such that it allows reliable and quick control even when the housing is open and the control panel is exposed. Specifically, the control panel has at least one corresponding finger-operable mechanical key in addition to the finger-operable optical key in order to reliably and quickly control the measuring device when a predefined control distance for the optical key is no longer ensured by the control and inspection window of the housing.

19 Claims, 3 Drawing Sheets

(56) References Cited

FOREIGN PATENT DOCUMENTS

| | | | |
|---|---|---|---|
| JP | 11-339585 | A | 12/1999 |
| JP | 2008-146822 | A | 6/2008 |
| JP | 2008-232707 | A | 10/2008 |

* cited by examiner

CONTROL PANEL FOR A MEASURING DEVICE

BACKGROUND OF THE INVENTION

1. Field of the Invention

The invention relates to a control panel for a measuring device with a housing and at least one control and inspection window, and more particularly, to a control panel for a measuring device having at least one finger-operable optical key and at least one finger-operable mechanical key, wherein the at least one finger-operable optical key is operable through the control and inspection window using a finger.

2. Description of Related Art

Control panels for measuring devices have been known for decades in very different configurations. A window provided in the measuring device housing is usually only an inspection window such that measured values can typically be read on the measuring device through the inspection window. Settings of the measuring device e.g., measurement range, parameterization and calibration data, can also be displayed through the inspection window. Keys are provided in the majority of measuring devices for the purpose of control and the keys can be operated without opening the housing of the measuring device. For example, keys can be provided in the form of membrane keys on the outside of the housing.

Additionally, keys can be provided inside the housing of the measuring device. In particular, keys are generally provided inside the housing in instances in which the measuring device is not operated under laboratory conditions, but rather in an industrial process environment under occasionally harsh environmental conditions or in areas subject to explosion hazards. Consequently, in these instances, the measuring device can usually only be controlled when the housing of the measuring device is opened.

However, if it is intended to be possible to control the measuring device when the housing is closed without the control keys penetrating through the housing, then it is possible to use a control panel with at least one finger-operable optical key having a transmitting element and a receiving element. A finger-operable optical key uses the transmitting element to emit electromagnetic radiation, often in the infrared range, and the receiving element for detecting at least electromagnetic radiation of the type emitted by the transmitting element. The method of operation of such an optical key is known and based on the principal that an operating object which approaches the optical key reflects the electromagnetic radiation emitted by the transmitting element to different extents. The result of the reflected radiation is applied to the transmitting element with different intensities depending on the distance between the operating object and the optical key. The reflected radiation detected by the receiving element is then used to detect the state "operate." In this instance, the optical keys are arranged with the control panel behind the inspection window of the measuring device housing in such a manner that finger operation of the optical key can be detected in a particularly effective manner if the control finger comes to rest on the control and inspection window above the optical key. In particular, there is sufficient reflection of the electromagnetic radiation emitted by the transmitting element at this distance to activate the state "operated."

However, the disadvantage of the finger-operable optical key is that it is no longer reliably possible to control a measuring device provided with the previously known control panel when the housing of the measuring device is open and the control panel is exposed. For example, this situation occurs when servicing the measuring device. Specifically, this situation occurs when there is an increased setting need under certain circumstances and a comparatively large number of data items have to be input via the keys. In this instance, the distance between the optical key and the control finger, which is otherwise defined by the control and inspection window, is no longer defined. Thus, intentional operation of the optical key can no longer be reliably distinguished from unintentional influencing of the optical key.

SUMMARY OF THE INVENTION

Based on the above-mentioned problems of the known art, it is a primary object of the present invention to provide a control panel for a measuring device of the type described above that allows reliable and fast control even when the control and inspection window are open and the control panel is exposed. Specifically, when a defined control distance for the optical key is no longer ensured.

The above primary object is achieved by providing at least one corresponding finger-operable mechanical key in addition to the finger-operable optical key. In particular, the control panel is provided with at least one corresponding finger-operable mechanical key in addition to the finger-operable optical key.

Providing at least one corresponding finger-operable mechanical key ensures that a control and inspection window, which is important for operating the optical key, is not necessary because it is possible to operate the at least one corresponding finger-operable mechanical key corresponding to the optical key. A mechanical key corresponding to the optical key has a functionality comparable to that of the optical key. For example, a comparable event is triggered by operating a mechanical key corresponding to an optical key. It is advantageous that, after the control and inspection window of the measuring device housing has been opened or removed, the mechanical key can be operated and it is no longer necessary to resort to the optical key. This allows for quick and reliable control of the measuring device having the control panel.

In an aspect of the invention, the optical key and the mechanical key can be arranged at a distance from one another. For example, the mechanical keys are arranged on the control panel in such a manner that they are not visible to an operator through a closed control and inspection window of the measuring device housing. Specifically, the mechanical keys appear only after the housing has been opened.

An alternative aspect of the invention, provides for the mechanical keys to be arranged in an immediate operating area of the optical keys. When it is stated that, the additional mechanical key is provided in the "immediate operating area" of the finger-operable optical key, this means that the optical key and the corresponding mechanical key are practically not controllable independently of one another during use. By way of non-limiting example, the optical key and the corresponding mechanical key lie together in the range of one square centimeter or in the range of a few square centimeters. In particular, the optical key and the mechanical key are arranged with respect to one another in such a manner that during the process of operating the mechanical key using a finger, the optical key is also unavoidably operated using the finger. During the finger operation process, the operating finger approaches the mechanical key and must naturally cross the space immediately above the optical key. If the corresponding optical key has its detection area precisely there, then operation of the optical key when operating the mechanical key cannot be quite deliberately avoided.

According to another aspect of the invention, a keypad is provided with marks on the control panel. The optical key and the corresponding mechanical key are arranged within the marked up common keypad. This arrangement makes it possible for the operator of the control panel to discern where operation is necessary in order to operate the desired key irrespective of whether it is the optical key or the mechanical key corresponding to the optical key.

According to another aspect of the invention, the optical key and the corresponding mechanical key are arranged beside one another in the control panel. This arrangement enables a particularly simple implementation of the control panel using standard components since the optical key and the mechanical key do not have to be implemented in a structural unit.

According to another aspect of the invention, the optical key is provided to be at least partially arranged in the mechanical key. In particular, the transmitting element of the optical key or the receiving element of the optical key is arranged in the mechanical key. This arrangement makes it possible to achieve, in a very reliable manner, a situation in which the finger-operable optical key and the additional finger-operable mechanical key corresponding to the latter are implemented in the form of a structural and also functional unit. Therefore, this arrangement makes it possible for the optical key to be unavoidably operated during the process of operating the mechanical key using the finger.

Accordingly to another aspect of the invention, the transmitting element and the receiving element of the optical key are oriented with respect to one another such that when operating the mechanical key using a finger, particularly when the control finger rests on the mechanical key, virtually no reflection of the radiation emitted by the transmitting element of the optical key into the receiving element of the optical key is possible. The term "virtually no reflection" means that less than 10% of the maximum reflection passes from the transmitting element into the receiving element when the control finger rests on the key.

Considerably smaller reflection portions are also possible if the transmitting element and/or the receiving element of the optical key is/are embedded in an optically dense holder in such a manner that, when the control finger rests on the key, the only optical opening in the holder for the transmitting element or the receiving element is optically closed. This arrangement actually completely precludes reflection.

According to another aspect of the invention, at least one evaluation unit is provided for the purpose of detecting the operation of the optical key and of the mechanical key. The operation of the keys can be detected using a single evaluation unit but may also be detected using a plurality of evaluation units. In an alternative aspect of the control panel, the evaluation unit is set up in such a manner that it deactivates the optical key as soon as the mechanical key has been operated and the housing of the measuring device is open. If a plurality of finger-operable optical keys are implemented with a plurality of corresponding finger-operable mechanical keys, the evaluation unit is preferably configured in such a manner that all optical keys are deactivated when a mechanical key has been operated. This arrangement of the evaluation unit of the control panel makes it possible to prevent incorrect operation of the control panel.

Potential incorrect operation results solely from the fact that, when operating the mechanical key, the corresponding optical key is also always triggered at the same time or shortly beforehand, and undesirable double triggering would be detected. The optical key can be deactivated by different alternative measures or measures which can be carried out together; the transmitting element can be switched off and/or the circuitry of the receiving element can be switched to a defined state, which is independent of the external influencing state or the evaluation of the received signal. An evaluation unit other than that for deactivating/activating the optical keys is preferably provided for detecting the operation of the keys.

In this context, provision is made for the deactivated optical key to be automatically activated again by the evaluation unit after a defined prescribed time and/or for the deactivated optical key to be activated again by an operating pattern of the corresponding mechanical key, e.g., by repeatedly operating a mechanical key within a short period of time. In addition or alternatively, it is also possible, when there are a plurality of optical and corresponding mechanical keys, for the deactivated optical keys to be activated again by the evaluation unit by the combined simultaneous operation of at least two mechanical keys.

According to another aspect of the invention, the evaluation unit can be provided to evaluate the intensity of the radiation received by the receiving element. In particular, the evaluation unit can be provided to evaluate the temporal profile of the intensity, preferably by scanning the receiving element in a fixed time grid. This makes it possible not only to determine the instantaneous absolute influencing state of the receiving element but also to detect an operating movement with the result that intentional operation of the optical key can be distinguished from "wiping past" the optical key, for example.

According to another aspect of the invention, the evaluation unit can be provided to declare the optical key to be "operated" when it detects that the intensity of the radiation received by the receiving element remains the same over a predefined period of time e.g., provides a corresponding operating signal. The evaluation unit preferably detects not only whether the intensity remains the same for a certain period of time but also whether the intensity is in a predefined range. Thus, additionally making it possible to avoid incorrect detection of the operating state, for example, as a result of external radiated interference.

The control panel according to the invention also has the advantage that it provides a "quick" control option using the mechanical keys corresponding to the optical keys because the optical keys react in a relatively slow manner in comparison with the mechanical keys. This is due to the fact that, as discussed above, the evaluation of the received signal provided by the receiving element requires a considerable amount of signal processing in order to reliably generate a detection signal.

The present invention is described in the detailed description which follows, with reference to the accompany drawings which show, by way of non-limiting examples, exemplary embodiments of the present invention.

DETAILED DESCRIPTION OF THE INVENTION

Figure 1:
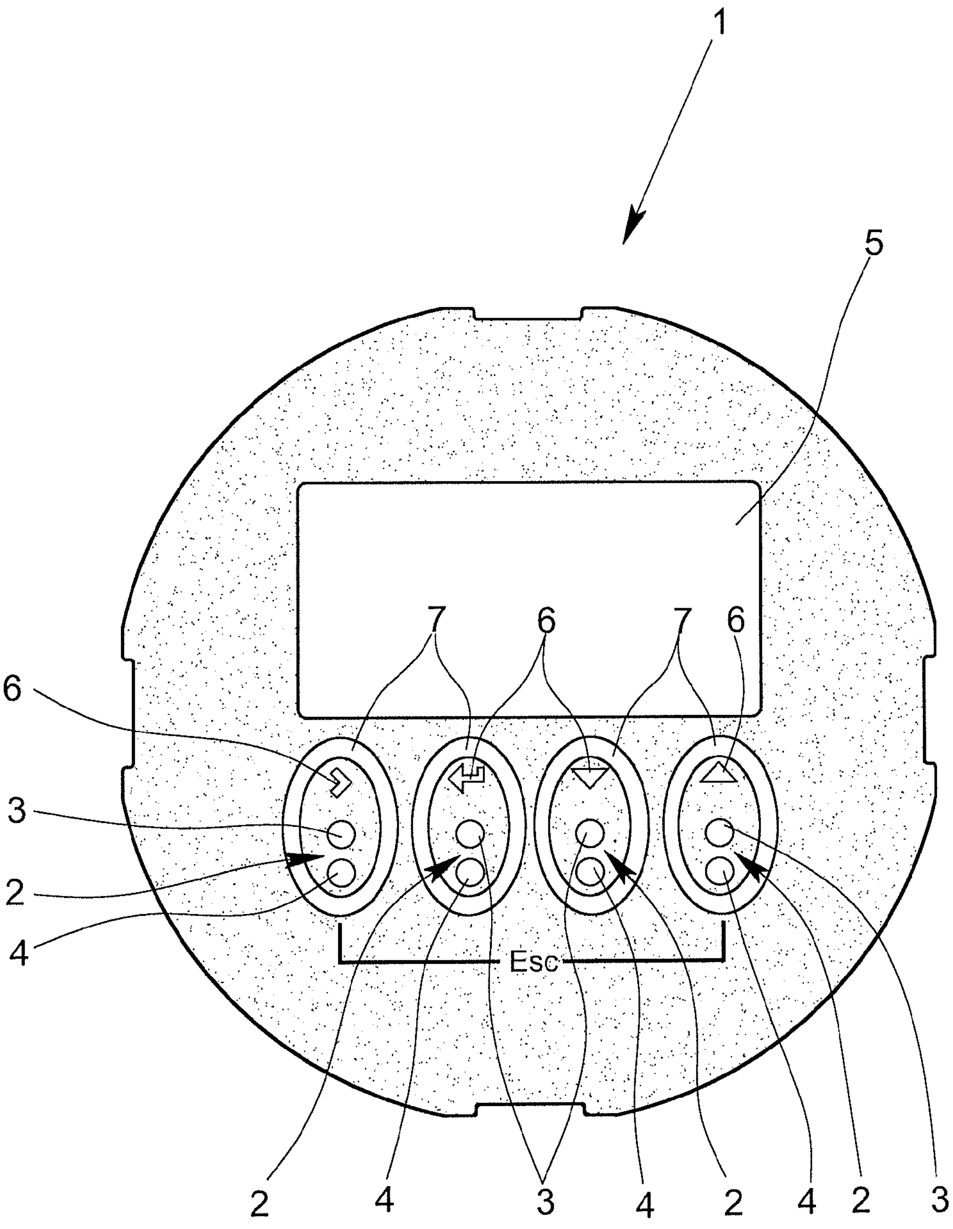
FIG. 1 shows a first exemplary embodiment of a control panel according to the invention.
Figure 2:
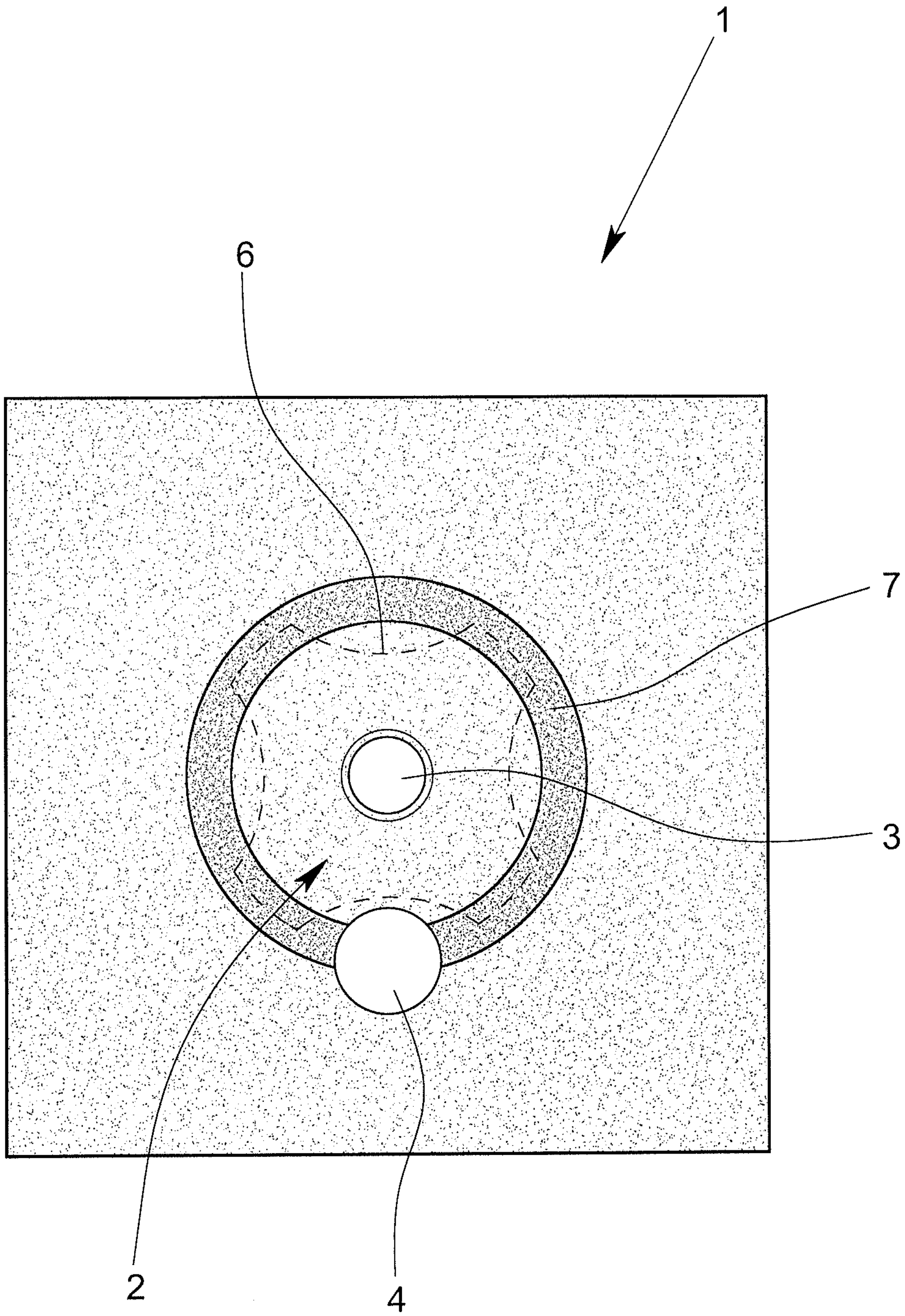
FIG. 2 shows a second exemplary embodiment of a control panel according to the invention.
Figure 3:
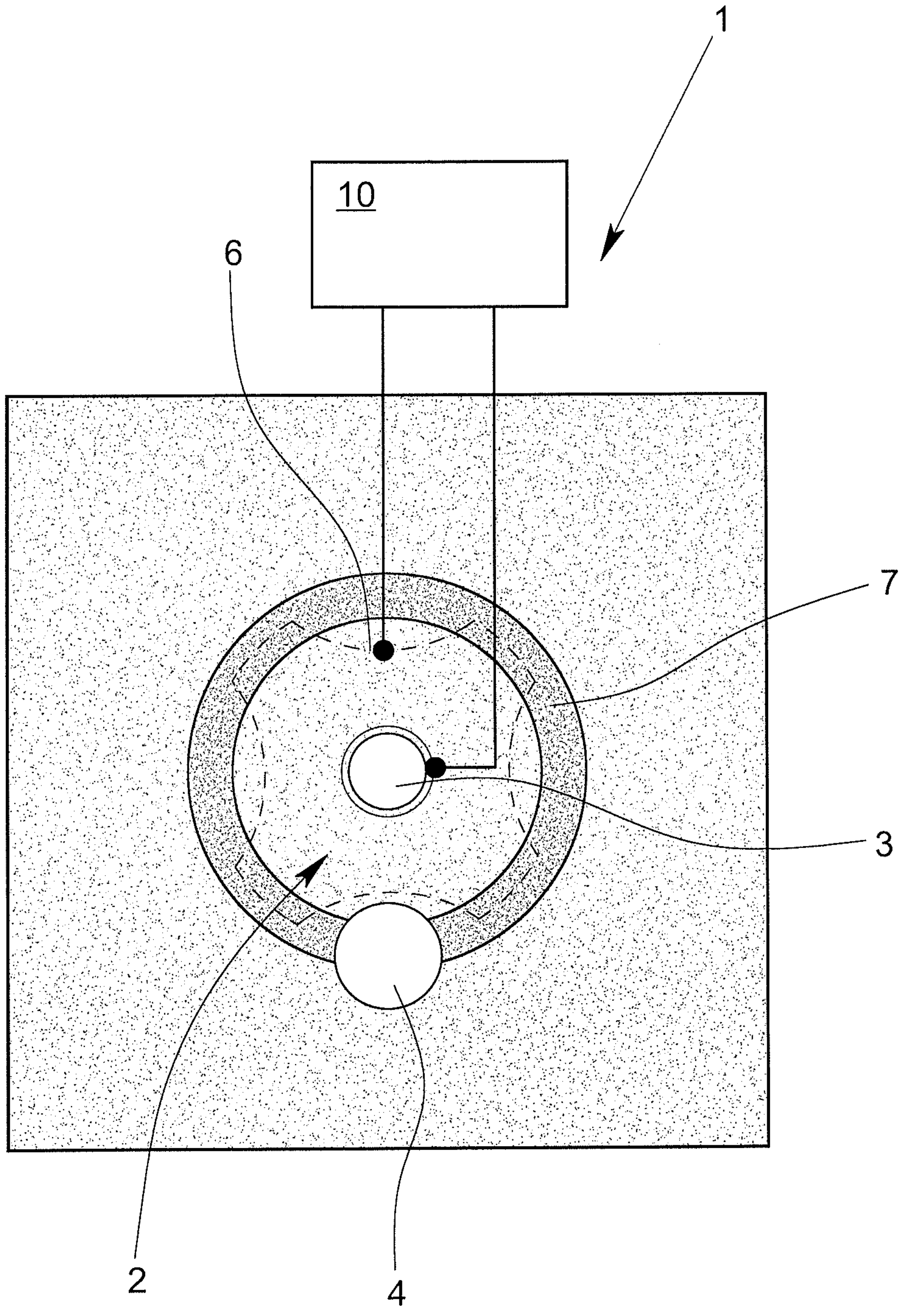
FIG. 3 shows the previous exemplary embodiment of a control panel according to the invention with an evaluation unit.

FIGS. 1 to 3 each illustrate a control panel 1 for a measuring device with a housing having a control and inspection window, not all of the measuring device being illustrated. Specifically, the housing with a control and inspection window is not illustrated.

In FIG. 1, the control panel 1 has a plurality of finger-operable optical keys 2. The optical keys 2 each having a transmitting element 3 and a receiving element 4. By way of non-limiting example, the transmitting elements 3 are infrared transmitting diodes and the receiving elements 4 are infrared receiving diodes. The infrared radiation emitted by the transmitting elements 3 is reflected to different extents by an operating finger approaching the optical keys 2 depending on the distance between the finger and the transmitting elements 3. A different input of infrared radiation received at the respective receiving element 4 is set depending on the state of approach of the operating finger to the optical key 2 to be operated.

In the embodiment of the control panel 1 illustrated in FIG. 1, the different optical keys 2 are arranged beside one another below a display panel 5 such that the optical keys 2 cannot influence one another. In particular, the optical keys 2 can be controlled in such a manner that the display panel 5 is not concealed during control.

The control panels 1 illustrated in FIGS. 1 and 2 are configured in such a manner that a corresponding finger-operable mechanical key 6 is respectively provided for each finger-operable optical key 2. However, while the invention has been described in terms of embodiments, those of skill in the art will recognize that the control panels may be configured with modifications e.g., in such a manner that a corresponding mechanical key 6 does not exist for every optical key 2. As illustrated in FIGS. 1 and 2, each mechanical key 6 is arranged in the immediate operating area of the optical key 2 corresponding to respective mechanical key. The immediate operating area of the optical key 2 being understood as meaning that, during practical use, the corresponding finger-operable optical key 2 is also respectively triggered when operating the finger-operable mechanical key 6.

In FIG. 1, a marked keypad 7 is respectively provided on the control panel 1 for each optical key 2 and for each mechanical key 6 assigned to the respective optical key 2. Specifically, an optical key 2 and its corresponding mechanical key 6 are arranged together in a respective keypad 7. By way of non-limiting example, the keypads 7 presented in the exemplary embodiment in FIG. 1 are oval shaped, and the keypads 7 presented in the exemplary embodiment in FIG. 2 are circle shaped. In this manner, the marked keypads 7 make it clear to the operator which optical key 2 and mechanical key 6 correspond together on the control panels 1.

In FIG. 1, the optical keys 2 and the associated mechanical keys 6 are each arranged in the control panel 1 and the common keypads 7 next to one another, i.e., side by side. In particular, the optical keys and the mechanical keys are arranged above one another in the exemplary embodiment in FIG. 1.

In the exemplary embodiments illustrated in FIGS. 1 and 2, the transmitting elements 3 and the receiving elements 4 of the optical keys 2 are each oriented with respect to one another in such a manner that the reflection maximum detected by the receiving element 4 is at a distance from a surface of the mechanical key 6, and thus, the reflection maximum is also at a distance from a surface of the control panels 1. This ensures that there is a particularly suitable triggering point above the mechanical key 6 and the optical key 2, i.e., above the surface of the control panel 1. Therefore, if the housing of the measuring device (not illustrated here) is closed positioning the control and inspection window above the surface of the control panel, then the movement of a control finger is limited by the control and inspection window to an optimum reflection distance when the control finger rests on the control and inspection window.

In FIGS. 1 and 2, the transmitting element 3 and the receiving element 4 of the optical key 2 are oriented with respect to one another in such a manner that, when the mechanical key 6 is operated using a finger, e.g., when the control finger rests on the mechanical key 6, practically no reflection of the infrared radiation emitted by the transmitting element 3 of the optical key 2 into the receiving element 4 of the optical key 2 is possible. In the exemplary embodiment according to FIG. 1, this is ensured by the optical key 2 being arranged in the immediate vicinity of the mechanical key 6 corresponding to the respective optical key. Therefore, during finger operation, the transmitting element 3 is automatically covered such that practically no infrared radiation passes into a relevant reflection area of the optical key 2.

In contrast, in the exemplary embodiment according to FIG. 2, the control panel 1 is configured such that the optical key 2 is partially arranged in the mechanical key 6. Particularly, the transmitting element 3 of the optical key 2 is arranged in the mechanical key 6. Alternatively, the receiving element 4 of the optical key 2 is arranged in the mechanical key. The contour of the mechanical key 6 is indicated by a dashed line in FIG. 2. The optical key 2 and the mechanical key 6 are arranged with respect to one another in such a manner that during the process of operating the mechanical key 6 the operating finger approaches the keys 2 and 6 and the optical key 2 is unavoidably operated. Substantially the same way as the emission of infrared radiation is virtually reliably and unavoidably prevented when the mechanical key 6 is operated using a finger, i.e., when the operating finger rests on the mechanical key 6.

The exemplary embodiment according to FIG. 3 is similar to that of FIG. 2 but it additionally shows an evaluation unit 10, which is connected to the mechanical key 6 and the optical key 2. The evaluation unit 10 can detect the switching states of the mechanical key 6 and the optical key 2. This enables the evaluation unit 10 to control the switching behaviour of the optical key 6 on its own, the switching behaviour of the optical key together with the mechanical key 6 and finally the switching behaviour of the overall control panel 1 as shown in FIG. 1.

The evaluation unit 10 is implemented, here, using a programmable microcontroller, solutions with Field-programmable Gate Array (FPGA) are possible as well. The evaluation unit 10 is configured to detect operation of the described one finger-operable optical key 2 and the shown one finger-operable mechanical key 6. The evaluation unit 10 further deactivates the at least one finger-operable optical key 2 as soon as the finger-operable mechanical key 6 is operated.

If a plurality of finger-operable optical keys 2 exists as shown in FIG. 1 the evaluation unit 10 deactivates all of the plurality of finger-operable optical keys 2 when at least one finger-operable mechanical 6 key is operated.

What is claimed is:

1. A control panel for a measuring device including a housing and at least one control and inspection window, the control panel comprising:

at least one finger-operable optical key comprising a transmitting element and a receiving element, and the at least one optical key is constructed to be operable through the at least one control and inspection window using a control finger;

at least one finger-operable mechanical key corresponding in function to the at least one finger-operable optical key; and at least one evaluation unit that is configured to detect operation of said at least one finger-operable optical key and said at least one finger-operable mechanical key, said at least one evaluation unit being operable for deactivating said at least one finger-operable optical key as soon as said at least one finger-operable mechanical key is operated, and said at least one evaluation unit being operable for deactivating said at least one finger-operable optical key by acting on at least one of said transmitting element and said receiving element of said at least one finger-operable optical key.

2. The control panel according to claim 1, wherein said at least one evaluation unit deactivates said at least one finger-operable optical key as soon as said at least one finger-operable mechanical key is operated when said housing is open.

3. The control panel according to claim 1, wherein the at least one finger-operable mechanical key is arranged in immediate proximity to an operating area of the at least one finger-operable optical key.

4. The control panel according to claim 3, wherein the at least one finger-operable optical key and the at least one finger-operable mechanical key are arranged with respect to one another such that the at least one finger-operable mechanical key and the at least one finger-operable optical key are unavoidably operated together when a finger is used to operate the at least one finger-operable mechanical key.

5. The control panel according claim 4, wherein each finger-operable optical key and functionally corresponding finger-operable mechanical key are arranged in a respective commonly identified keypad on the control panel.

6. The control panel according to claim 5, wherein the at least one finger-operable optical key and the at least one finger-operable mechanical key are arranged beside one another in the respective keypad on the control panel.

7. The control panel according to claim 5, wherein the at least one finger-operable optical key is at least partially arranged in the at least one finger-operable mechanical key.

8. The control panel according to claim 1, wherein the at least one finger-operable optical key and the at least one finger-operable mechanical key are arranged with respect to one another such that the at least one finger-operable mechanical key and theat least one finger-operable optical key are unavoidably operated together when a finger is used to operate the at least one finger-operable mechanical key.

9. The control panel according claim 1, wherein each finger-operable optical key and functionally corresponding finger-operable mechanical key are arranged in a respective commonly identified keypad on the control panel.

10. The control panel according to claim 9, wherein the at least one finger-operable optical key and the at least one finger-operable mechanical key are arranged beside oneanother in the keypad on the control panel.

11. The control panel according to claim 1, wherein the at least one finger-operable optical key is at least partially arranged in the at least one finger-operable mechanical key.

12. The control panel according to claim 11, wherein one of the transmitting element of the at least one finger-operable optical key and the receiving element of the at least one finger-operable optical key is arranged in the at least one finger-operable mechanical key.

13. The control panel according to claim 1, wherein the transmitting element and the receiving element of the at least one finger-operable optical key are arranged with respect to one another such that a maximum reflection detected by the receiving element is at a predetermined distance from a surface of the at least one finger-operable mechanical key and at a predetermined distance from a surface of the control panel.

14. The control panel according to claim 1, wherein the transmitting element and the receiving element of the at least one finger-operable optical key are arranged with respect to one another such that, when a finger of an operator rests on the at least one finger-operable mechanical key, practically no reflection of radiation emitted by the transmitting element of the at least one finger-operable optical key into the receiving element of the optical key is possible.

15. The control panel according to claim 1, wherein:

the at least one finger-operable optical key comprises a plurality of finger-operable keys, and the at least one evaluation unit deactivates all of the plurality of finger-operable keys when the at least one finger-operable mechanical key is operated.

16. The control panel according to claim 1, wherein the deactivated at least one finger-operable optical key is reactivatable by the at least one evaluation unit in response to a determination of the occurrence at least one of: a lapse of a predefined period of time, an operating pattern of the corresponding at least one finger-operable mechanical key and a combined operation of at least two finger-operable mechanical keys.

17. The control panel according to claim 1, wherein the at least one evaluation unit is adapted for evaluating an intensity of radiation received by the receiving element.

18. The control panel according to claim 17, wherein the at least one evaluation unit is adapted for evaluating a temporal profile of the intensity of radiation received by the receiving element.

19. Control panel according to claim 18, wherein the at least one evaluation unit is adapted for determining the at least one finger-operable optical key to be operated when the at least one finger-operable optical key detects that the intensity of the radiation received by the receiving element remains the same over a predefined period of time and within a predetermined acceptable range of intensity.

* * * * *